(12) United States Patent
Zhang

(10) Patent No.: US 9,759,861 B2
(45) Date of Patent: Sep. 12, 2017

(54) HYBRID PHOTONIC AND ELECTRONIC INTEGRATED CIRCUITS

(71) Applicant: STMicroelectronics, Inc., Coppell, TX (US)

(72) Inventor: John H. Zhang, Altamont, NY (US)

(73) Assignee: STMicroelectronics, Inc., Coppell, TX (US)

( * ) Notice: Subject to any disclaimer, the term of this patent is extended or adjusted under 35 U.S.C. 154(b) by 24 days.

(21) Appl. No.: 14/983,078

(22) Filed: Dec. 29, 2015

(65) Prior Publication Data

US 2016/0131838 A1 May 12, 2016

Related U.S. Application Data

(62) Division of application No. 14/045,640, filed on Oct. 3, 2013, now Pat. No. 9,405,065.

(51) Int. Cl.
| | |
|---|---|
| *H01L 21/4763* | (2006.01) |
| *G02B 6/122* | (2006.01) |
| *H01L 23/522* | (2006.01) |
| *G02B 6/13* | (2006.01) |
| *H01L 21/768* | (2006.01) |
| *H01L 23/532* | (2006.01) |
| *H01L 21/66* | (2006.01) |
| *G02B 6/12* | (2006.01) |

(52) U.S. Cl.
CPC .......... *G02B 6/122* (2013.01); *G02B 6/1225* (2013.01); *G02B 6/13* (2013.01); *H01L 21/76802* (2013.01); *H01L 21/76879* (2013.01); *H01L 21/76883* (2013.01); *H01L 22/12* (2013.01); *H01L 23/522* (2013.01); *G02B 2006/121* (2013.01); *H01L 22/14* (2013.01); *H01L 23/53209* (2013.01); *H01L 2924/0002* (2013.01)

(58) Field of Classification Search
CPC .................................. G02B 6/13; G02B 6/122
USPC ......................................................... 438/627
See application file for complete search history.

(56) References Cited

U.S. PATENT DOCUMENTS

| | | | |
|---|---|---|---|
| 6,231,744 B1 * | 5/2001 | Ying | B82B 1/00 205/206 |
| 8,324,622 B2 | 12/2012 | Zhang et al. | |
| 2006/0063368 A1 * | 3/2006 | Sharma | B81C 99/009 438/618 |

(Continued)

FOREIGN PATENT DOCUMENTS

JP 2010-245514 A 10/2010

*Primary Examiner* — Ajay K Arora
(74) *Attorney, Agent, or Firm* — Seed IP Law Group LLP

(57) ABSTRACT

A sequence of processing steps presented herein is used to embed an optical signal path within an array of nanowires, using only one lithography step. Using the techniques disclosed, it is not necessary to mask electrical features while forming optical features, and vice versa. Instead, optical and electrical signal paths can be created substantially simultaneously in the same masking cycle. This is made possible by a disparity in the widths of the respective features, the optical signal paths being significantly wider than the electrical ones. Using a damascene process, the structures of disparate widths are plated with metal that over-fills narrow trenches and under-fills a wide trench. An optical cladding material can then be deposited into the trench so as to surround an optical core for light transmission.

20 Claims, 5 Drawing Sheets

(56) References Cited

U.S. PATENT DOCUMENTS

| | | |
|---|---|---|
| 2007/0007579 A1* | 1/2007 | Scheuerlein ........ G11C 11/5614 |
| | | 257/315 |
| 2008/0138088 A1* | 6/2008 | Welch .................... H01S 5/026 |
| | | 398/183 |
| 2009/0252871 A1 | 10/2009 | Coiffic et al. |
| 2010/0116976 A1 | 5/2010 | Wober |
| 2010/0127233 A1 | 5/2010 | Goux et al. |
| 2015/0211960 A1* | 7/2015 | Shimizu ............. G02B 6/02057 |
| | | 356/73.1 |

* cited by examiner

HYBRID PHOTONIC AND ELECTRONIC INTEGRATED CIRCUITS

RELATED APPLICATION

This patent application is a divisional of U.S. patent application Ser. No. 14/045,640 filed Oct. 3, 2013, which application is hereby incorporated by reference in its entirety.

BACKGROUND

Technical Field

The present disclosure relates to fabrication, on a semiconductor substrate, of microcircuits that carry electronic signals in the same process with those that carry optical signals.

Description of the Related Art

For many years, microelectronic integrated circuits (ICs) have been manufactured separately from photonic integrated circuits (PICs). Microelectronic ICs are typically built on silicon substrates. Photonic circuits are typically built on other substrates such as those made from III-V semiconductors, including gallium arsenide (GaAs), indium phosphide (InP), and the like, that have optical properties suitable for use in making semiconductor lasers for fiber optic communications. Thus, optoelectronic products, used for processing visible light signals such as, for example, waveguides, optical detectors, optical amplifiers and the like, historically have been made in separate factories from microelectronic products used for computation. Such products may include, for example, transistor-based memories and processors of various kinds such as microprocessors, specialized graphics processors, signal processors, and the like.

In the past, combining optical and electrical signals on the same IC chip has been done on a custom basis as opposed to a mass production basis. However, with the intertwining of digital processing and information storage with wireless communication functions, there is now considerable interest in mass-producing microcircuits that combine optical signal paths and electronic signal paths on a common substrate.

BRIEF SUMMARY

A sequence of processing steps presented herein is used to embed an optical signal path within an array of copper metal lines, during fabrication of the same integrated circuit. In one embodiment, using the techniques disclosed, it is not necessary to mask electrical features while forming optical features, and vice versa. Instead, optical and electrical signal paths can be created substantially simultaneously in the same mask patterning cycle. In other embodiments, some locations where optical structures will be formed are masked when forming electrical structures and vice versa. But even in these embodiments, the electrical signal paths and the optical signal paths are formed closely adjacent to each other in the same semiconductor substrate. Such techniques thus increase efficiency of the overall fabrication process and provide a significant cost advantage.

In one embodiment, a variety of widths of the respective features, optical signal paths being significantly wider than electrical ones, is used advantageously. The process entails use of a metal deposition step which tends to over-fill narrow trenches formed in a high-k inter-layer dielectric, while only partially filling wide trenches. Thus, in the same deposition step, electrical signal paths are fully formed at the same time as formation of an outer barrier to the optical signal path. Subsequent processing steps complete formation of a core optical path without introducing additional masks. Chemical-mechanical polishing is used to remove material deposited on top of metal lines. Finally, a silicon carbide/nitride ($SiC_xN_y$) cap layer is blanket deposited to cover the electronic structure, and to complete the photonic structure. The resulting hybrid microcircuit includes a densely patterned region of narrow inlaid features adjacent to a wide inlaid feature.

In one embodiment, the narrow inlaid features are copper nanowires having widths and spacing in the range of, for example, 30-40 nm, while the wide inlaid feature is an insulated glass tube having a width in the range of about 100-300 nm, or about ten times wider than the nanowires. Alternatively, the width of the optical signal transmission line can also be much larger, for example, tens or hundreds of microns wide. Such a structure can be inlaid according to a damascene process in which trenches are etched in an ultra-low k inter-layer dielectric (ILD) and subsequently filled with copper by plating. Alternatively, a mask is formed over the optical path during some or all of the metal forming step.

BRIEF DESCRIPTION OF THE SEVERAL VIEWS OF THE DRAWINGS

In the drawings, identical reference numbers identify similar elements. The sizes and relative positions of elements in the drawings are not necessarily drawn to scale.

DETAILED DESCRIPTION

Figure 1:
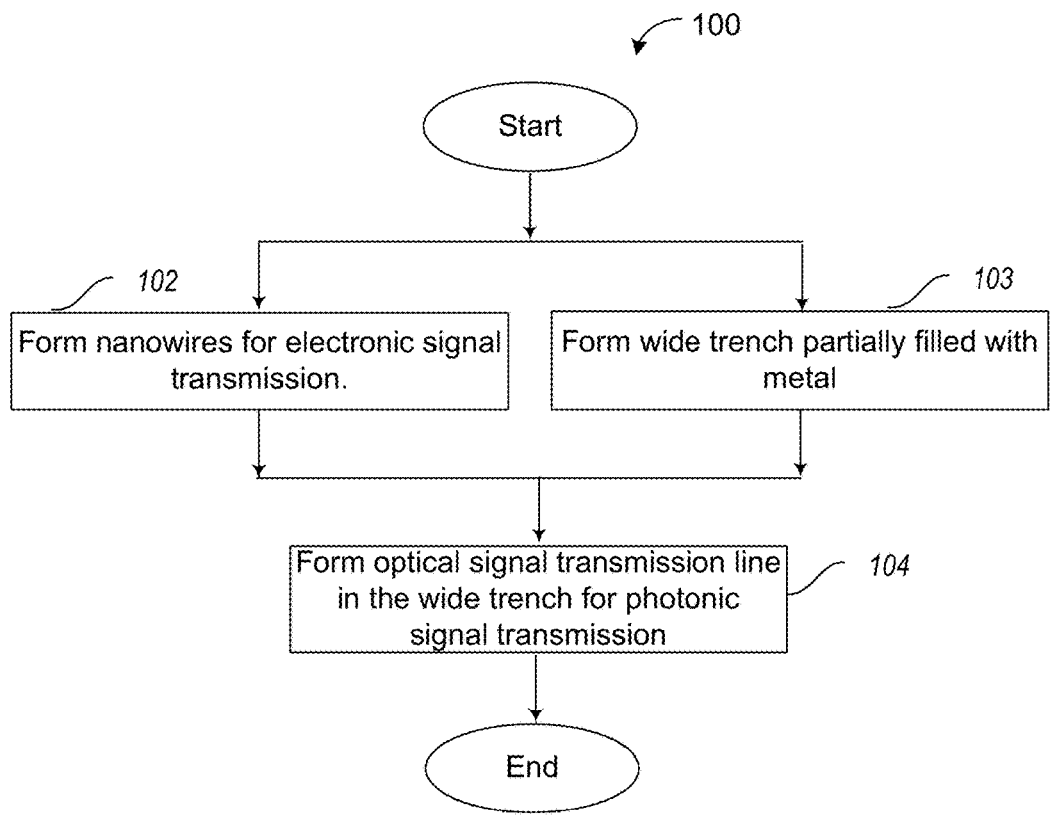
FIG. 1 is a high-level process flow diagram showing an overview of a method of making a hybrid microcircuit structure, according to one embodiment.
Figure 2:
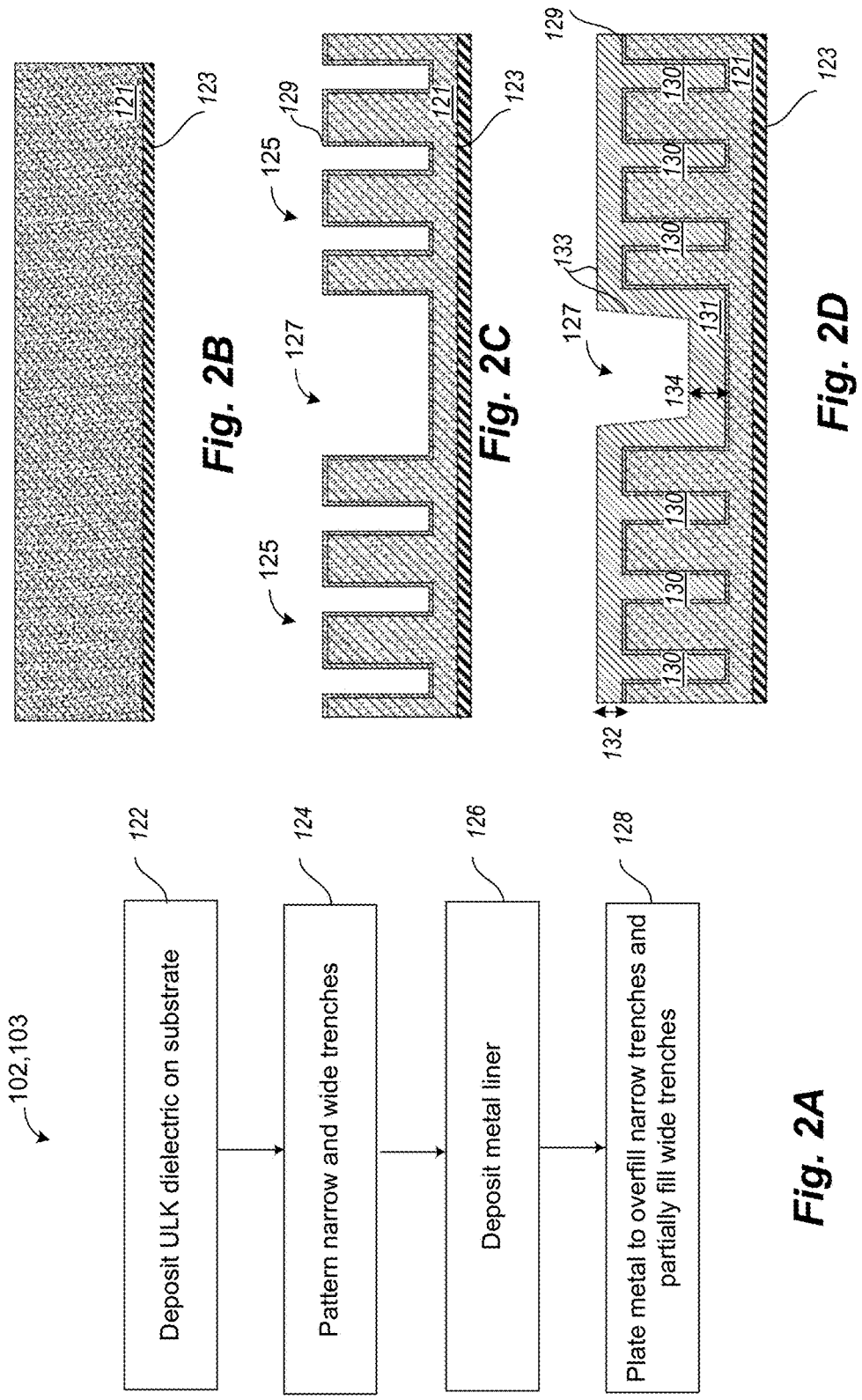
FIG. 2A is a detailed process flow diagram showing a sequence of process steps that can be used to create nanowires adjacent to a partially-filled wide trench, according to one embodiment.
FIGS. 2B-2D are cross-sectional views of profiles formed by each of the process steps shown FIG. 2A.
Figure 3:
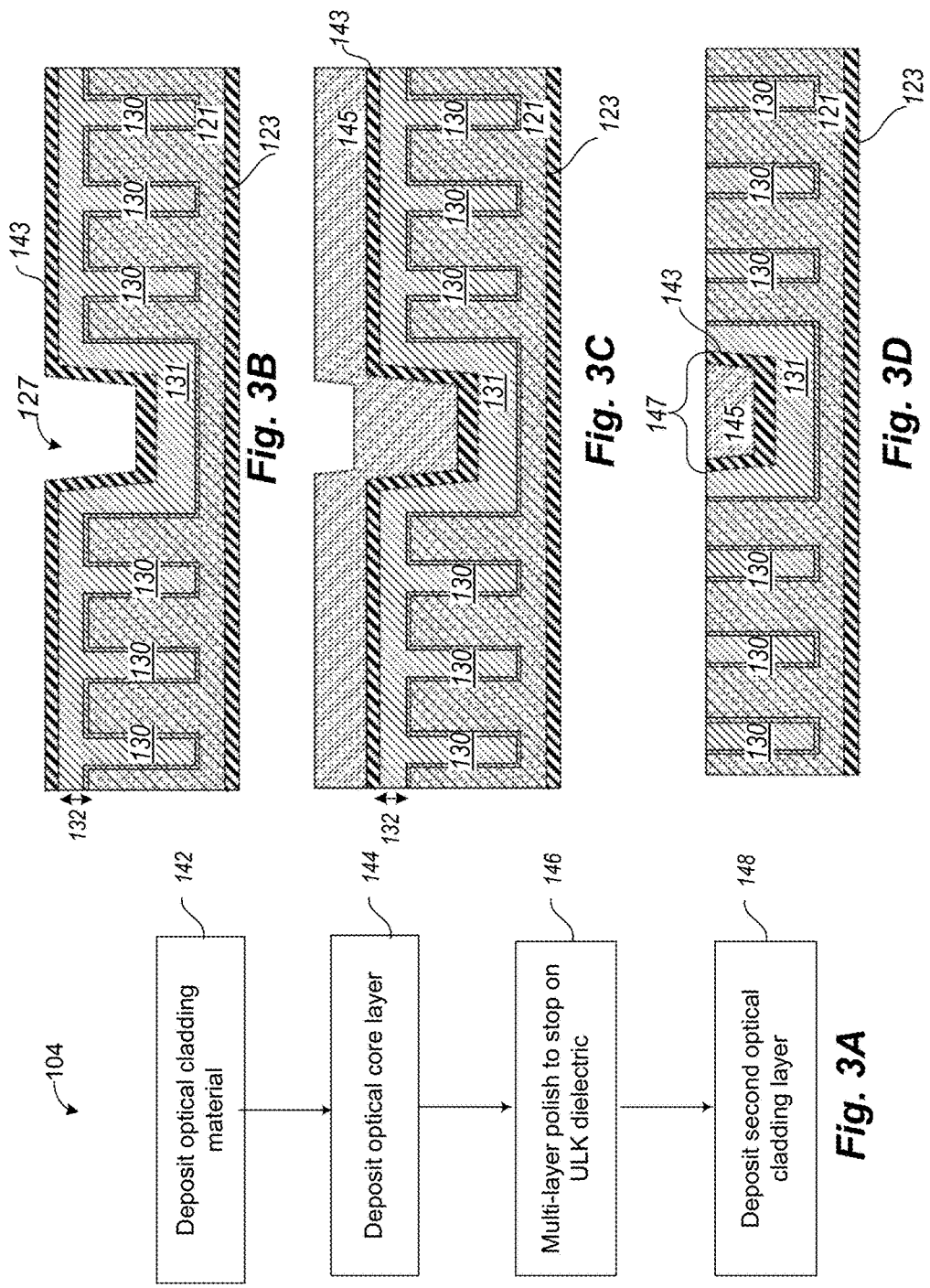
FIG. 3A is a detailed process flow diagram showing a sequence of process steps that can be used to create an optical signal transmission line.
FIGS. 3B-3D are cross-sectional views of profiles formed by each of the process steps shown FIG. 3A.

In the following description, certain specific details are set forth in order to provide a thorough understanding of various aspects of the disclosed subject matter. However, the disclosed subject matter may be practiced without these specific details. In some instances, well-known structures and methods of semiconductor processing comprising embodiments of the subject matter disclosed herein have not been described in detail to avoid obscuring the descriptions of other aspects of the present disclosure.

Unless the context requires otherwise, throughout the specification and claims that follow, the word "comprise" and variations thereof, such as "comprises" and "comprising" are to be construed in an open, inclusive sense, that is, as "including, but not limited to."

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same aspect. Furthermore, the particular features, structures, or characteristics may be combined in any suitable manner in one or more aspects of the present disclosure.

Fabrication of microcircuits generally entails performing a series of deposition and patterning operations to build integrated structures on a semiconductor substrate, one layer at a time. Each layer is formed by growing or depositing a film on the substrate, patterning a photo-sensitive mask using lithography, and transferring the mask pattern to the film by etching. Often, structures already formed on the substrate are protected by hard masks while new structures are created. Such use of hard masks adds masking layers to the fabrication process. Overall fabrication costs scale with the number of layers used and the number of mask patterning cycles needed. Lithography masks are expensive to design and to integrate into an existing fabrication process. For these reasons, it is generally advantageous to reduce the number of mask patterning cycles if alternative processing schemes can be substituted.

Reference throughout the specification to integrated circuits is generally intended to include integrated circuit components built on semiconducting substrates, whether or not the components are coupled together into a circuit or able to be interconnected. Throughout the specification, the term "layer" is used in its broadest sense to include a thin film, a cap, or the like.

Reference throughout the specification to conventional thin film deposition techniques for depositing silicon nitride, silicon dioxide, metals, or similar materials include such processes as chemical vapor deposition (CVD), low-pressure chemical vapor deposition (LPCVD), metal organic chemical vapor deposition (MOCVD), plasma-enhanced chemical vapor deposition (PECVD), plasma vapor deposition (PVD), atomic layer deposition (ALD), molecular beam epitaxy (MBE), electroplating, electro-less plating, and the like. Specific embodiments are described herein with reference to examples of such processes. However, the present disclosure and the reference to certain deposition techniques should not be limited to those described. For example, in some circumstances, a description that references CVD may alternatively be done using PVD, or a description that specifies electroplating may alternatively be accomplished using electro-less plating. Furthermore, reference to conventional techniques of thin film formation may include growing a film in-situ. For example, in some embodiments, controlled growth of an oxide to a desired thickness can be achieved by exposing a silicon surface to oxygen gas or to moisture in a heated chamber.

Reference throughout the specification to conventional photolithography techniques, known in the art of semiconductor fabrication for patterning various thin films, includes a spin-expose-develop process sequence typically followed by an etch process. Alternatively or additionally, photoresist can also be used to pattern a hard mask such as a silicon nitride hard mask, which, in turn, can be used to pattern an underlying film.

Reference throughout the specification to conventional etching techniques known in the art of semiconductor fabrication for selective removal of polysilicon, silicon nitride, silicon dioxide, metals, photoresist, polyimide, or similar materials includes such processes as wet chemical etching, reactive ion etching (RIE), washing, wet cleaning, pre-cleaning, spray cleaning, chemical-mechanical planarization (CMP) and the like. Specific embodiments are described herein with reference to examples of such processes. However, the present disclosure and the reference to certain deposition techniques should not be limited to those described. In some instances, two such techniques may be interchangeable. For example, stripping photoresist may entail immersing a sample in a wet chemical bath or, alternatively, spraying wet chemicals directly onto the sample.

Specific embodiments are described herein with reference to planarized metal interconnect structures and photonic structures that have been produced; however, the present disclosure and the reference to certain materials, dimensions, and the details and ordering of processing steps are exemplary and should not be limited to those shown. The term "planarization" is used in its broadest sense, to include the term "polishing" as one example of planarization. The term "photonic" is used as a counterpart to the term "electronic" to describe miniaturized light circuits. The term "opto-electronic" refers to combinations of electronic and photonic circuits and/or circuit elements.

In the figures, identical reference numbers identify similar features or elements. The sizes and relative positions of the features in the figures are not necessarily drawn to scale.

FIG. 1 shows generalized steps in a fabrication method 100 for producing a hybrid microcircuit structure, according to one embodiment described herein.

At 102, an array of nanowires is formed for electronic signal transmission. At the same time, a wide trench is formed that is partially filled with metal.

At 104, within the wide trench, an optical signal transmission line is formed for photonic signal transmission.

Details of the fabrication method 100 are presented below, with reference to FIGS. 2A-4D.

FIGS. 2A-2D describe and show details of the steps 102, 104 that are carried out to form a partially-filled wide trench among narrow metal lines, as shown in FIG. 2D. Such a structure can be formed in a variety of ways. Shown in FIG. 2B is an example of a dielectric layer 121, which has been formed over a substrate 123. The dielectric layer 121 can be any layer in which metal lines will be formed during the semiconductor manufacturing process. In one embodiment, the dielectric layer 121 is an inter-metal dielectric layer such as a low-k dielectric, wherein k represents a dielectric constant that characterizes the dielectric material. Such an inter-metal dielectric layer may be located between metals 1 and 2, metals 3 and 4, or other metal interconnect layers, for example. In other embodiments, the baser layer 121 is a combined set of layers formed prior to a first metal interconnect layer. In such an example, the baser layer 121 can include a monocrystalline semiconductor substrate which has been overlaid with multiple layers. Such layers can include layers of oxides, nitrides, gate electrodes made of polysilicon or metal, sidewall spacers, contact openings, or other transistor-level features that are commonly formed before the first metal layer. The substrate 123 can also be made of, for example, silicon carbide-nitride $SiC_xN_y$, having a thickness of about 15-32 nm.

At 122, the dielectric layer 121 is formed as a thick ultra-low-k (ULK) dielectric on the substrate 123. In the embodiment shown, the ULK dielectric desirably has a dielectric constant, k, in the range of about 2.0-3.0 and a thickness target of about 200 nm.

At 124, an array of narrow trenches 125, encompassing a wide trench 127, is patterned in the dielectric layer 121 by conventional lithography and reactive ion etching (RIE) processes. This is the only such lithography patterning step needed in the process disclosed herein. In some embodiments, other lithography patterning steps might be used, but in its simplest form, this process is permitted to be fully carried out by using only a single photolithographic step, which makes this technique low cost and very simple. Subsequent processing entails deposition and chemical-mechanical planarization operations, but no further lithography is needed.

The resulting irregular surface features, as shown in FIG. 2C, may also be formed by depositing and etching to create non-uniform layers of significantly different heights, for example gates formed over a substrate, sidewall spacers adjacent the gates, gate electrodes overlying the gates, and further insulation layers overlying such gate electrodes; all of which are adjacent to openings to a silicon semiconductor substrate, which is another technique by which surface structures having different heights may be formed.

Patterning the dielectric layer 121 generally produces the narrow trenches 125 and the wide trench 127 in close proximity to one another within a common die. In one embodiment, the depths of the narrow trenches 125 and of the wide trench 127 are in the range of about 30-100 nm so that the narrow trenches 125 have a high aspect ratio, for example, about 3:1. For example, for a 20 nm technology node, the target trench depth is 68 nm while for a 10 nm technology node, the target trench depth is 52 nm. The line widths and spaces, or pitch, of the narrow trenches 125 are 40 nm for a 20 nm technology node and 32 nm for a 10 nm technology node. A representative width of the wide trench 127 is within the range of about 200-2000 nm.

At 126, a conformal, thin trench liner 129 is deposited in the narrow trenches 125 and in the wide trench 127. The trench liner 129 forms a barrier between the ULK material and the trench fill material to be deposited next. The trench liner 129 can include two layers, for example, a bottom layer made of titanium nitride (TiN) that adheres well to the ULK dielectric material of the dielectric layer 121, and a top layer made of tantalum nitride (TaN) that provides a barrier to subsequent deposition of a copper interconnect layer. Such a two-layer trench liner 129 can have a representative total thickness of 8-10 nm.

At 128, a metal plating process is carried out to overfill the narrow trenches 125 by about 50-100% to form nanowires 130 while only partially filling the wide trench 127 by about 25-50% with a trench fill material 131, as shown in FIG. 2D. The trench fill material 131 in the embodiment shown is desirably a metal suitable for use as a nanowire interconnect material. Such metals include, for example, copper, aluminum, tungsten, silver, gold, titanium, platinum, tantalum, or combinations thereof. Combinations of such metals include layered metal stacks or alloys. The trench fill material 131 tends to fill up the narrow trenches 125 first, resulting in an over-fill, while the wide trench 127 remains only partially filled. Thus, the hybrid structure, after metal deposition, exhibits an irregular surface 133 having different characteristic thicknesses of metal corresponding to the respective narrow trenches 125, and wide trenches 127, respectively. Thus, the thickest areas, namely the tallest metal layers, of the irregular surface 133 correspond to patterned regions having the narrowest features, and the thinnest areas of the irregular surface 133 correspond to patterned areas having the widest features.

The trench fill process can be a plasma deposition process such as chemical vapor deposition (CVD) or plasma vapor deposition (PVD). Alternatively, the trench fill process can be a plating process such as electroplating or electro-less plating. The filling process is desirably targeted to achieve at least a desired thickness of the wide inlaid features. The deposition process of the metal is preferably conformal to ensure that all the features of the various trenches are completely filled. Even though the deposition is preferably conformal, because of the variations in the widths of the trenches and the disparity in height between adjacent features, the deposition may not be fully conformal, and may be thicker on bottom surfaces than on side surfaces. This may result in further emphasizing the differences in height of the various surface features, further increasing the unevenness and irregularity of the uppermost surface.

In one embodiment, the plating process includes depositing a copper seed layer followed by a bulk copper layer. For a 20 nm technology node, the copper can be raised above the top of a 68 nm trench by an additional metal overfill 132 within the range of about 30-60 nm, while a trench metal thickness 134 measures around 50 nm or less, in the range of about 30-60 nm.

FIGS. 3A-3D describe and show details of the step 106 in which a optical line 147 is formed for optical signal transmission.

At 142, a first optical cladding layer 143 is deposited over the irregular surface 133, as shown in FIG. 3B. The first optical cladding layer 143 is deposited as a conformal layer that forms three sides of an optical cladding that will surround an optical core. In one embodiment, the first optical cladding layer 143 is made of an insulating material that is substantially conformal with the underlying trench fill topography. In one embodiment, composition of the first optical cladding layer 143 is a nitride film such as a silicon carbide-nitride ($SiC_xN_y$) having a thickness within the range within the range of about 30-50 nm. Other insulating silicon nitride compositions can also be used, as well as insulating materials that deposit substantially conformally. There are a number of optical cladding materials known in the art, and any that can be deposited in a conformal manner on a substrate are acceptable.

At 144, an optical core layer 145 is deposited so as to fill the wide trench 127, as shown in FIG. 3C. In one embodiment, the optical core layer 145 is made of silicon dioxide ($SiO_2$), polysilicon, or a similar transparent material suitable for transmission of light. The optical core layer 145 is selected to have an index of refraction $n_1$ that is less than the index of refraction $n_2$ of the cladding material, so as to satisfy a condition (1) for total internal reflection (TIR), $$\theta_c = \arcsin(n_2/n_1), \qquad (1)$$

as is well known by those skilled in the art of optoelectronics. According to the TIR condition (1), $\theta_c$ is a critical angle of incidence needed to contain light within the core material. If the cladding material is $SiC_xN_y$, for example, values of x and y that determine a ratio of silicon carbide to silicon nitride, can be adjusted to tune the index of refraction $n_2$ of the cladding material relative to $n_1$ so that the TIR condition (1) is satisfied.

Other transparent materials may be used for the optical core layer 145, taking into account the material selected for the cladding layer 143, and being able to deposit the optical core material on a substrate. The optical core layer 145 can be deposited in either a conformal layer or a non-conformal layer. The object is to fully fill the wide trench 127 with the optical core layer material 145.

At 146, a CMP process is performed in which the optical core layer 145, the first optical cladding layer 143, and the metal overfill 132 are removed over the nanowires 130, as shown in FIG. 3D. The CMP process can entail use of a slurry made from silica and hydrogen peroxide ($H_2O_2$), and a soft polish pad. In one embodiment, step 146 can be performed as a three-step CMP in which separate timed steps, or separate end-pointed steps are used to remove the optical core layer 145, the first optical cladding layer 143, and the metal overfill 132 in succession. For example, such a three-step planarization process can be carried out as follows:

At 146a, the upper, exposed portion of optical core layer 145 is removed by polishing the core layer material to stop on the first optical cladding layer 143 in the regions over the nanowires 130.

At 146b, the first optical cladding layer 143 is polished to stop on the metal overfill 132 over the nanowires 130.

At 146c, the metal overfill 132 is polished to stop on the ULK dielectric, dielectric layer 121. Such polishing may also remove an upper portion of the nanowires 130.

A touch CMP process can further be performed to gently remove remnants of the metal overfill 132. The touch CMP process can be a brief surface polish in which the polish pad rotation speed and pressure are set to relatively low values to remove residual amounts of material while limiting the degree of surface abrasion. Alternatively, a touch clean can be substituted for the touch CMP process. The touch clean can use, for example, a wet clean chemistry that includes hydrofluoric acid (HF) diluted with de-ionized water (DI) in a 1000:1 ratio (DI:HF). Alternatively, the chemistry of the etch slurry in the CMP etch may be changed to be less aggressive in etching the metal overfill 132. For example, the first etch chemistry of the first CMP etch as carried out in step 146a may be an aggressive, high pressure etch that etches almost all surface features evenly, namely the optical core layer 145, the first optical cladding layer 143, and the metal trench fill material 131 are etched at a generally uniform rate by the first CMP process 146a. This first CMP process 146a continues until a selected etch stop time has elapsed. i.e., as a timed etch that will stop after a selected time interval. Alternatively, the first CMP process 146a may be an end-point etch that is designed to stop upon reaching a selected feature, such as detecting a presence of the material in the dielectric layer 121 as being released, or some other end point indicating that the aggressive CMP is to be concluded, and a light CMP, (also referred to herein as a touch CMP), process is then to be carried out. As mentioned, the second CMP process 146b may have a chemical composition which is different from that used in 146a, which is not as aggressive in etching the first optical cladding layer 143. Therefore, during the second CMP step 146b, removal of the first optical cladding layer 143 is predominantly carried out by the polishing aspect of the CMP process rather than by the chemical aspect of the CMP process. A final planar surface, shown in FIG. 3D, is thus achieved without much, if any, chemical etching of the metal overfill 132. Because the metal overfill regions are polished mechanically, and not subject to chemical removal, gouges and associated puddle defects are prevented.

Alternatively, the use of a multistep CMP process at 146 is not required, according to one embodiment of the invention. In one embodiment, a CMP process is used that etches through the top three layers in a single etch step. Such a CMP process is preferentially chemically selective to the ILD 121. Such a single etch step can be carried out in a somewhat aggressive fashion against the optical core layer 145, the first optical cladding layer 143, and the metal overfill 132 until chemical elements of the ILD 121 are detected, or until a timer has run out.

At 148, a second optical cladding layer 147 is deposited on the top planarized surface shown in FIG. 3D. The second optical cladding layer 147 is made of the same material as the first optical cladding layer 143, for example, $SiC_xN_y$. The second optical cladding layer 147 provides a fourth side of optical cladding on the upper surface of the hybrid microcircuit structure to enclose the optical path. With the second optical cladding layer 147 in place, the optical core layer 145 is surrounded by the cladding material, which ensures that light does not escape the optical core layer 145. Meanwhile, the second optical cladding layer 147 also provides an insulating cover for the nanowires 130.

Figure 4:
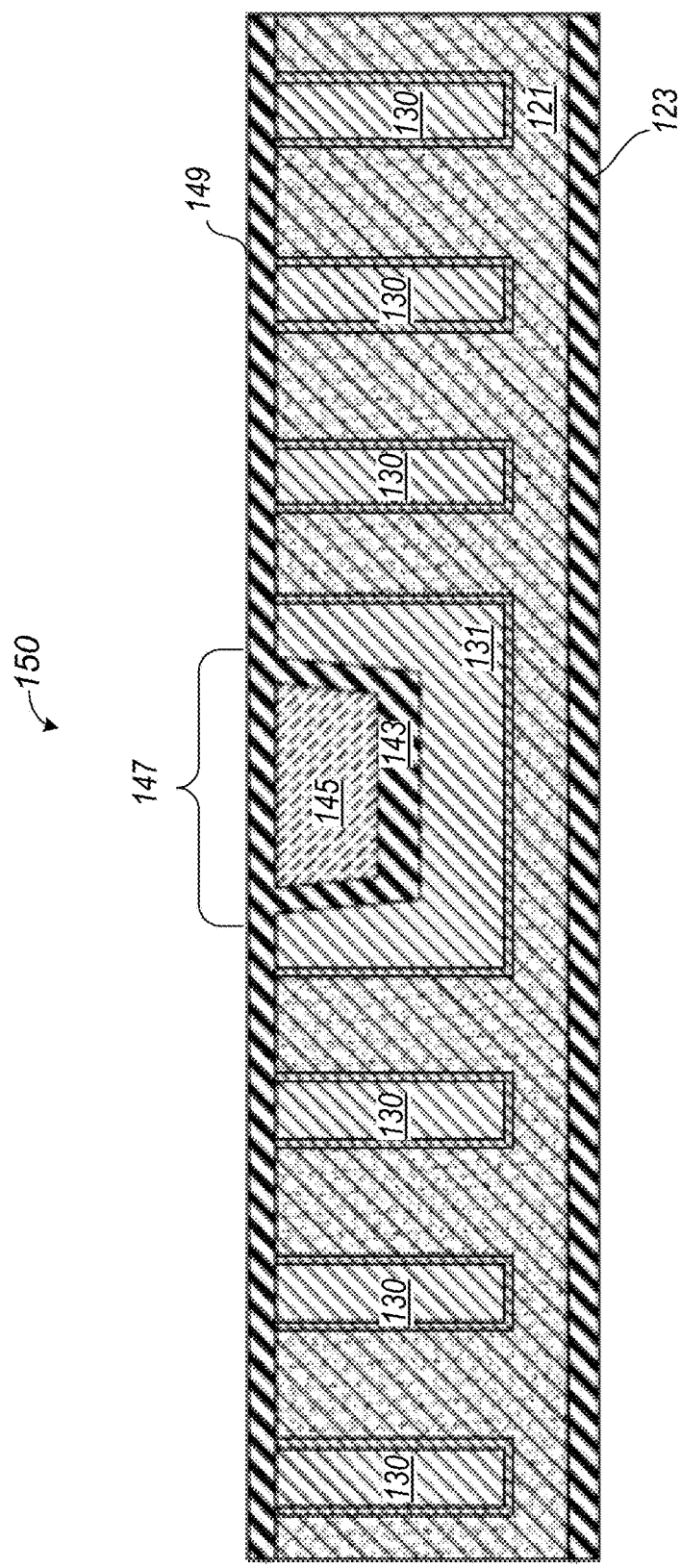
FIG. 4 is a cross-sectional view of a completed hybrid microcircuit structure that can be used as a circuit element for electronic-photonic applications.

FIG. 4 shows a cross-sectional device profile of a completed hybrid microcircuit structure 150 that is operable to transmit both electric and photonic signals. According to one embodiment disclosed herein, only one lithography step was used to make the hybrid microcircuit structure 150. Such a structure takes advantage of the fill characteristics of adjacent trenches that have disparate trench widths, as shown in FIG. 2C. The tendency for the wide trench to be under-filled allows an opportunity for embedding the optical signal transmission line in the metal trench fill material 131. Fabrication of the hybrid microstructure 150 as described above provides an efficient and cost-effective way to integrate electronic and photonic circuit elements on the same chip to support a variety of applications.

One application for such a hybrid microcircuit structure relates to an alternative method of electrically testing integrated circuits. A conventional way of performing in-line electrical testing of an integrated circuit chip is to probe the integrated circuit chip via a designated array of metal probe pads. The metal probe pads are electrically coupled to various test points along metal interconnects within the integrated circuit chip. The prober makes electrical contact with the probe pads by positioning a set of metal prober pins on the probe pads. The metal pins tend to cause microscopic scratches on the pads, causing metal protrusions on the pad surface. Such metal protrusions can later release unwanted metallic components during downstream processing steps following the in-line electrical testing step. The metallic components can poison the chemical environment of the downstream processing steps, thus modifying the downstream process in an undesirable and uncontrolled fashion.

A method of repairing probe pad damage by using a CMP technique is described in U.S. Pat. No. 8,324,622 to the present inventor. Alternatively, replacing the metal prober pins with an optical probe would eliminate entirely the metal-to-metal contact at the probe pads, thereby preventing formation of metal protrusions. Thus, instead of in-line electrical testing, in-line optical testing could be used, with significant advantage, by replacing the metal probe pads on the integrated circuit chip with one or more hybrid microcircuit structures as described herein.

The plane of the cross-section cut shown in FIG. 4 does not show connections to the completed hybrid microcircuit structure 150 for inputting and outputting signals.

Figure 5:
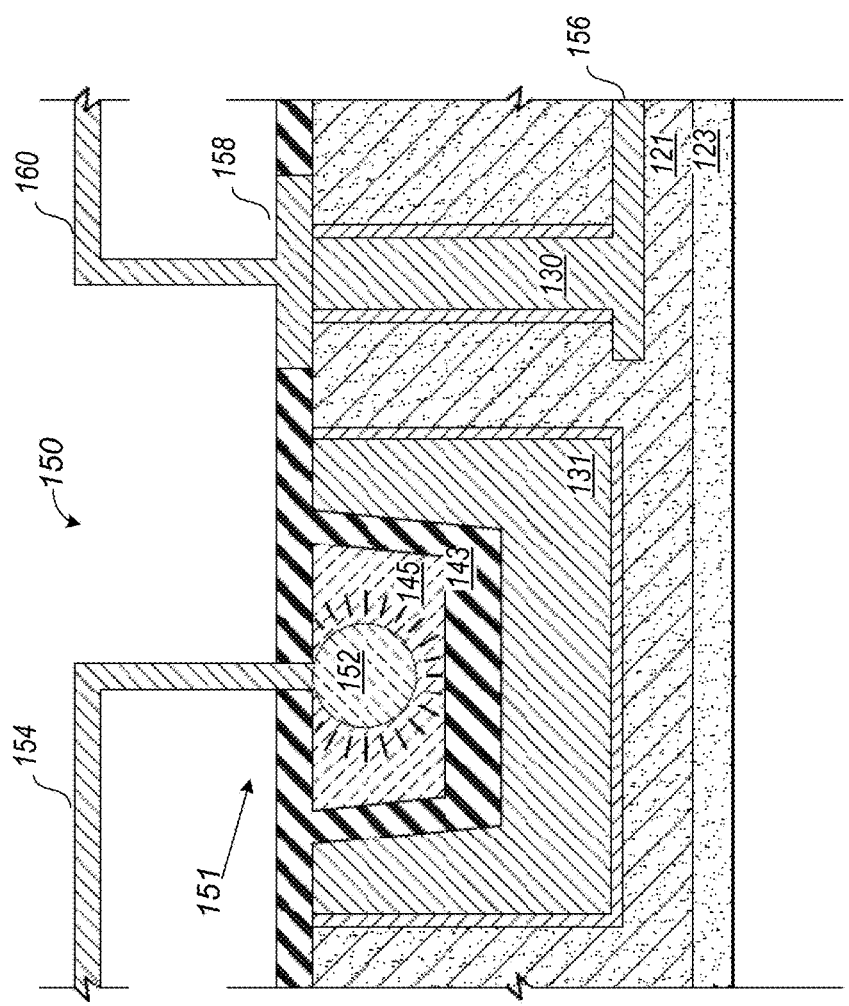
FIG. 5 Is a cross-sectional view of the completed hybrid microcircuit structure shown in FIG. 4, further showing representative interconnects and an embodiment of a light source.

FIG. 5 illustrates how external and internal connections can be made to the hybrid microcircuit structure 150 in one embodiment, for example, to be used in a probe application as described above. FIG. 5 shows the hybrid microcircuit structure 150 in cross-section, wherein the cross-sectional cut plane shown in FIG. 5 is at a different location along the optical line 147 than the cross-sectional cut plane shown in FIG. 4. In FIG. 5, a light input port 151 is shown in which a photonic light source 152 is indicated which can be placed at the end of the optical line 147. The photonic light source 152 can be, for example, a light-emitting diode (LED), a laser source, or an illuminated end of another optical fiber. A signal connection 154 supplies a control signal to the photonic light source 152. The signal connection 154 can be external as shown, or integrated with the substrate 123 or films thereon, wherein a dielectric layer may separate the signal connection 154 from the cladding layer 149. The signal connection 154 can be an electrical wire or an optical fiber, such that the light input port 151 couples light from one or more other optical waveguides into the optical line 147 that is part of the hybrid microcircuit structure 150.

The nanowire 130 can be coupled to other electronic components integrated with the substrate 123 via an integrated metal line 156. Additionally, the nanowire 130 can be coupled to external components via, for example, a pad 158, coupled to an external wired signal connection 160. The signal connections 154 and 160 generally represent interconnects to the photonic and electronic circuit elements, wherein the interconnects can be configured differently than in the example shown.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

It will be appreciated that, although specific embodiments of the present disclosure are described herein for purposes of illustration, various modifications may be made without departing from the spirit and scope of the present disclosure. Accordingly, the present disclosure is not limited except as by the appended claims.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method comprising:
    forming a dielectric layer on a substrate having a top surface;
    forming, in the dielectric layer, an array of first trenches adjacent to at least one second trench;
    depositing metal simultaneously into the first trenches and the second trench;
    continuing to deposit metal into both the first trenches and the second trench for a sufficient time to completely fill the first trenches so as to form nanowires operable to transmit electrical signals in electrical signal paths along lengths of the nanowires, and to only partially fill the second trench;
    forming, in the second trench, an optical signal transmission line operable to transmit photonic signals in a direction substantially parallel to the electrical signal paths, the optical signal transmission line including an optical core having a core index of refraction; and
    forming a first optical cladding layer surrounding the optical core, the first optical cladding layer having a cladding index of refraction that is less than the core index of refraction.

2. The method of claim 1 wherein depositing the metal includes one or more of electroplating, electro-less plating, chemical vapor deposition (CVD) or plasma vapor deposition (PVD) processes.

3. The method of claim 1 wherein forming the optical signal transmission line further includes forming a dielectric cap in contact with the nanowires, and then replacing the dielectric cap with a second optical cladding layer.

4. The method of claim 3 wherein the replacing the dielectric cap with a second optical cladding layer includes removing the dielectric cap using a CMP process.

5. The method of claim 3 wherein the first and second optical cladding layers are made of a silicon carbide-nitride material.

6. The method of claim 1 wherein forming the second trench and the array of first trenches is accomplished during a single lithography cycle.

7. The method of claim 1 wherein the second trench is located between two of the first trenches.

8. The method of claim 1 wherein the dielectric layer is a ULK dielectric having a dielectric constant in a range of 2.0-3.0.

9. A method, comprising:
    forming an array of nanowires for electronic signal transmission in an integrated circuit chip;
    forming among the nanowires a second trench partially filled with metal; and
    forming within the second trench an optical signal transmission line for photonic signal transmission in a direction substantially parallel to the electronic signal transmission in the array of nanowires.

10. The method of claim 9 wherein the nanowires and the second trench are patterned together using a single photolithography step.

11. A method, comprising:
    forming an array of nanowires for electronic signal transmission in an integrated circuit chip;
    forming among the nanowires a second trench partially filled with metal; and
    forming within the second trench an optical signal transmission line for photonic signal transmission in a direction substantially parallel to the electronic signal transmission, wherein the nanowires and the metal partially filling the second trench are formed together using a single metal plating process.

12. The method of claim 9 wherein forming the nanowires entails forming an array of first trenches, overfilling the first trenches with metal and removing the metal overfill in a planarization process.

13. The method of claim 12 wherein forming the optical signal transmission line further includes forming an optical core having at least four sides and forming an optical cladding that surrounds the optical core on the at least -four sides.

14. The method of claim 13, further comprising carrying out a three-step planarization process to remove portions of the optical core, the optical cladding, and the metal overfill.

15. A method, comprising:
    forming an array of nanowires for electronic signal transmission in an integrated circuit chip;
    forming among the nanowires a second trench partially filled with metal;

forming within the second trench an optical signal transmission line for photonic signal transmission in a direction substantially parallel to the electronic signal transmission in the array of nanowires; and forming an optical cladding layer overlying the optical signal transmission line and the nanowires in the same process steps, the optical cladding layer also forming a cap layer over the nanowires.

16. A method, comprising:

forming a hybrid microcircuit that integrates an array of nanowires with an optical signal transmission line by carrying out the following steps:
  forming an array of nanowires for electronic signal transmission in an integrated circuit chip;
  forming among the nanowires a second trench partially filled with metal; and
  forming within the second trench an optical signal transmission line for photonic signal transmission in a direction substantially parallel to the electronic signal transmission in the array of nanowires; and
  performing in-line optical testing of the hybrid microcircuit by probing the optical signal transmission line using an optical probe external to the hybrid microcircuit.

17. The method of claim 16 wherein probing the optical signal transmission line includes:
  placing a photonic light source at a light input port of the optical signal transmission line;
  coupling an optical waveguide of the optical probe to the light input port; and
  supplying to the photonic light source a control signal via a signal connection from the optical probe.

18. The method of claim 17 wherein the nanowires and the metal partially filling the second trench are formed together using a single metal plating process.

19. The method of claim 17 wherein the signal connection for the control signal is an optical fiber.

20. The method of claim 17 wherein the signal connection for the control signal is an electrical wire.

* * * * *